(12) United States Patent
Meng et al.

(10) Patent No.: US 11,470,716 B2
(45) Date of Patent: Oct. 11, 2022

(54) ELECTRONIC DEVICE INCLUDING BONDED PARTS AND METHOD FOR DETECTING THE SAME

(71) Applicants: Chengdu BOE Optoelectronics Technology Co., Ltd., Sichuan (CN); BOE TECHNOLOGY GROUP CO., LTD., Beijing (CN)

(72) Inventors: Huan Meng, Beijing (CN); Qing Gong, Beijing (CN); Xu Lu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/331,421

(22) Filed: May 26, 2021

(65) Prior Publication Data
US 2022/0132658 A1   Apr. 28, 2022

(30) Foreign Application Priority Data
Oct. 26, 2020   (CN) .......................... 202011154599.6

(51) Int. Cl.
*H05K 1/02* (2006.01)
*H05K 5/00* (2006.01)
*G09G 3/00* (2006.01)
*H05K 13/00* (2006.01)

(52) U.S. Cl.
CPC ......... *H05K 1/0266* (2013.01); *H05K 5/0069* (2013.01); *H05K 13/0076* (2013.01)

(58) Field of Classification Search
CPC .... G09G 3/006; H05K 5/0069; H05K 1/0268; H05K 1/0266
See application file for complete search history.

(56) References Cited

U.S. PATENT DOCUMENTS

| | | | | |
|---|---|---|---|---|
| 10,670,629 | B2* | 6/2020 | Qu ...................... | G01R 1/06794 |
| 2010/0295567 | A1* | 11/2010 | Chang .................... | G01R 31/70 |
| | | | | 324/719 |
| 2014/0029230 | A1* | 1/2014 | Oh ........................... | H05K 1/14 |
| | | | | 361/803 |
| 2017/0196080 | A1* | 7/2017 | Meng ........................ | H05K 1/14 |
| 2017/0263165 | A1* | 9/2017 | Guo ....................... | G02F 1/1345 |

(Continued)

*Primary Examiner* — Hoa C Nguyen
*Assistant Examiner* — Amol H Patel
(74) *Attorney, Agent, or Firm* — Myers Bigel, P.A.

(57) ABSTRACT

An electronic device, which includes at least a first part and a second part bonded to each other is provided. The first part includes a first bonding area. The first bonding area includes at least one first testing area. The first testing area includes a plurality of testing pads. The second part includes a second boding area corresponding to the first bonding area. The second bonding area includes a plurality of testing terminals, and includes at least one second testing area respectively corresponding to the at least one first testing area. The second testing area includes a plurality of testing pins. The plurality of testing pads, the plurality of testing terminals and the plurality of testing pins are configured to form a current channel and a voltage testing channel, for measuring a resistance of bonded testing pads and testing pins on both the current channel and the voltage testing channel.

20 Claims, 5 Drawing Sheets

(56) References Cited

U.S. PATENT DOCUMENTS

| | | | |
|---|---|---|---|
| 2019/0116672 A1* | 4/2019 | Zhao | H05K 1/189 |
| 2019/0280074 A1* | 9/2019 | Li | G09G 3/006 |
| 2019/0348357 A1* | 11/2019 | Lee | H01L 23/4985 |
| 2021/0091162 A1* | 3/2021 | Kim | G09G 3/006 |
| 2021/0153343 A1* | 5/2021 | Shin | H05K 1/117 |
| 2021/0247859 A1* | 8/2021 | Gong | G06F 3/041 |
| 2022/0085261 A1* | 3/2022 | Min | H01L 27/3223 |

* cited by examiner

ELECTRONIC DEVICE INCLUDING BONDED PARTS AND METHOD FOR DETECTING THE SAME

CROSS REFERENCE TO RELATED APPLICATIONS

The present application claims the benefits of priority of Chinese patent application No. 202011154599.6 filed on Oct. 26, 2020, the entire disclosure of which is incorporated herein by reference.

TECHNICAL FIELD

This disclosure relates to the field of electronic technology, and specifically to an electronic device including bonded parts and a method for detecting the same.

BACKGROUND

With the development of electronic technology, the requirements for integration and performance of electronic devices have become higher and higher. Therefore, the bonding process is used to realize electrical connections between some parts of an electronic device. In this case, it is particularly important to be able to discover in time the bonding abnormalities that may occur among various parts in the production process of an electronic device and to accurately determine the locations where the bonding abnormalities occur. As a non-limiting example, in the production process of a display device, if the bonding abnormalities in the bonding process of a display panel, a flexible printed circuit (referred to as FPC hereinafter) board and a driver chip (referred to as IC hereinafter) can be found in time and determined accurately, the abnormalities can be quickly analyzed and handled, so that the yield rate of the display device can be ensured, and the increase in production cost can be avoided.

SUMMARY

According to a first aspect of this disclosure, an electronic device including bonded parts is provided, comprising: a first part, wherein the first part comprises a first bonding area, the first bonding area comprises at least one first testing area, the first testing area comprises a first testing pad, a second testing pad and a third testing pad, and the first testing pad is electrically connected with the second testing pad and the third testing pad; a second part, wherein the second part comprises a second bonding area corresponding to the first bonding area, the second bonding area comprises a first testing terminal, a second testing terminal, a third testing terminal and a fourth testing terminal, the second bonding area also comprises at least one second testing area respectively corresponding to the at least one first testing area, and the second testing area comprises a first testing pin, a second testing pin and a third testing pin, wherein the first testing pad is bonded with the first testing pin, the second testing pad is bonded with the second testing pin, the third testing pad is bonded with the third testing pin, and wherein, the first testing pin is electrically connected with the first testing terminal and the second testing terminal, the second testing pin is electrically connected with the third testing terminal, the third testing pin is electrically connected with the fourth testing terminal.

According to some exemplary embodiments, the first testing pad, the second testing pad and the third testing pad are arranged in one row, and the second testing pad or the third testing pad is located between the other two testing pads.

According to some exemplary embodiments, the first testing pad, the second testing pad and the third testing pad are arranged in one row, and the first testing pad is located between the second testing pad and the third testing pad.

According to some exemplary embodiments, at least one of the first part and the second part is a circuit board.

According to some exemplary embodiments, the electronic device is a display device, the first part is a display panel, and the second part is a flexible printed circuit board.

According to some exemplary embodiments, the electronic device further comprises a third part, wherein the third part comprises a third bonding area, the third bonding area comprises at least one third testing area, the third testing area comprises a fourth testing pin, a fifth testing pin and a sixth testing pin, and the fourth testing pin is electrically connected with the fifth testing pin and the sixth testing pin, wherein the first part further comprises: a fourth bonding area, wherein the fourth bonding area corresponds to the third bonding area and comprises at least one fourth testing area respectively corresponding to the at least one third testing area, the fourth testing area comprises a fourth testing pad, a fifth testing pad and a sixth testing pad; a fifth bonding area, wherein the fifth bonding area corresponds to the fourth bonding area and comprises at least one fifth testing area respectively corresponding to the at least one fourth testing area, the fifth testing area comprises a seventh testing pad, an eighth testing pad, a ninth testing pad and a tenth testing pad, wherein the second part further comprises a sixth bonding area corresponding to the fifth bonding area, the sixth bonding area comprises a fifth testing terminal, a sixth testing terminal, a seventh testing terminal and an eighth testing terminal, the sixth bonding area also comprises at least one sixth testing area respectively corresponding to the at least one fifth testing area, the sixth testing area comprises a seventh testing pin, an eighth testing pin, a ninth testing pin and a tenth testing pin, wherein the fourth testing pad is bonded with the fourth testing pin, the fifth testing pad is bonded with the fifth testing pin, the sixth testing pad is bonded with the sixth testing pin, the seventh testing pad is bonded with the seventh testing pin, the eighth testing pad is bonded with the eighth testing pin, the ninth testing pad is bonded with the ninth testing pin, the tenth testing pad is bonded with the tenth testing pin, wherein the seventh testing pin is electrically connected with the fifth testing terminal, the eighth testing pin is electrically connected with the sixth testing terminal, the ninth testing pin is electrically connected with the seventh testing terminal, the tenth testing pin is electrically connected with the eighth testing terminal, wherein the ninth testing pad is electrically connected with the fifth testing pad, the seventh testing pad and the eighth testing pad are both electrically connected with the fourth testing pad, the tenth testing pad is electrically connected with the sixth testing pad.

According to some exemplary embodiments, the fourth testing pin, the fifth testing pin and the sixth testing pin are arranged in one row, and the fifth testing pin or the six testing pin is located between the other two testing pins.

According to some exemplary embodiments, the fourth testing pin, the fifth testing pin and the sixth testing pin are arranged in one row, and the fourth testing pin is located between the fifth testing pin and the sixth testing pin.

According to some exemplary embodiments, at least one of the first part, the second part and the third part is a circuit board.

According to some exemplary embodiments, the electronic device is a display device, the first part is a display panel, the second part is a flexible printed circuit board, and the third part is a driving chip.

According to a second aspect of this disclosure, a method for detecting the above electronic device including the first part and the second part is provided. The method comprises: applying a first constant current signal through the first testing terminal and the third testing terminal, or through the second testing terminal and the fourth testing terminal, or through the first testing terminal and the fourth testing terminal, or through the second testing terminal and the third testing terminal; obtaining a first test voltage from two of four testing terminals of the second bonding area, which are not used for applying the first constant current signal; determining a first test resistance based on the first test voltage and the first constant current signal; determining whether the first test resistance meets a first preset resistance threshold.

According to some exemplary embodiments, in the electronic device to which the method is applied, the first testing pad, the second testing pad and the third testing pad are arranged in one row, and the second testing pad or the third testing pad is located between the other two testing pads.

According to some exemplary embodiments, in the electronic device to which the method is applied, the first testing pad, the second testing pad and the third testing pad are arranged in one row, and the first testing pad is located between the second testing pad and the third testing pad.

According to some exemplary embodiments, in the electronic device to which the method is applied, at least one of the first part and the second part is a circuit board.

According to some exemplary embodiments, in the electronic device to which the method is applied, the electronic device is a display device, the first part is a display panel, and the second part is a flexible printed circuit board.

According to some exemplary embodiments, a method for detecting the above electronic device including the first part, the second part and the third part is provided. The method comprises: applying a second constant current signal through the seventh testing terminal and the fifth testing terminal, or through the sixth testing terminal and the eighth testing terminal, or through the seventh testing terminal and the sixth testing terminal, or through the fifth testing terminal and the eighth testing terminal; obtaining a second test voltage from two of four testing terminals of the sixth bonding area, which are not used for applying the second constant current signal; determining a second test resistance based on the second test voltage and the second constant current signal; determining whether the second test resistance meets a second preset resistance threshold.

According to some exemplary embodiments, in the electronic device to which the method is applied, the fourth testing pin, the fifth testing pin and the sixth testing pin are arranged in one row, and the fifth testing pin or the six testing pin is located between the other two testing pins.

According to some exemplary embodiments, in the electronic device to which the method is applied, the fourth testing pin, the fifth testing pin and the sixth testing pin are arranged in one row, and the fourth testing pin is located between the fifth testing pin and the sixth testing pin.

According to some exemplary embodiments, in the electronic device to which the method is applied, at least one of the first part, the second part and the third part is a circuit board.

According to some exemplary embodiments, in the electronic device to which the method is applied, the electronic device is a display device, the first part is a display panel, the second part is a flexible printed circuit board, and the third part is a driving chip.

In the electronic device and the detection method thereof provided according to various aspects of the present disclosure, a current channel and a voltage testing channel, both of which are conductive, are formed by a plurality of testing pads, a plurality of testing terminals, and a plurality of testing pins, and the test resistance at the corresponding bonding point of the electronic device is accurately obtained through the test voltage obtained by the voltage testing channel and the constant current applied to the current channel, so that it is possible to accurately determine whether a circuit fault exists at the bonding point, and thus to determine whether an abnormality occurs during the bonding process. The cause of the electronic device being defective can be found in time, and its production efficiency and production yield can be effectively improved. Thus, the electronic device and the detection method have a wide range of application prospects.

BRIEF DESCRIPTION OF DRAWINGS

For the purpose of describing the technical solution of each exemplary embodiment of the present disclosure more clearly, the drawings that need to be used in the description of each exemplary embodiment will be briefly described hereinafter. It should be understood that the contents shown in the drawings are only some exemplary embodiments of the present disclosure, and they are not intended to limit the present disclosure. For those of ordinary skill in the art, based on the teachings of the present disclosure, other embodiments can be easily recognized according to these exemplary embodiments. In the drawings.

Figure 1A:
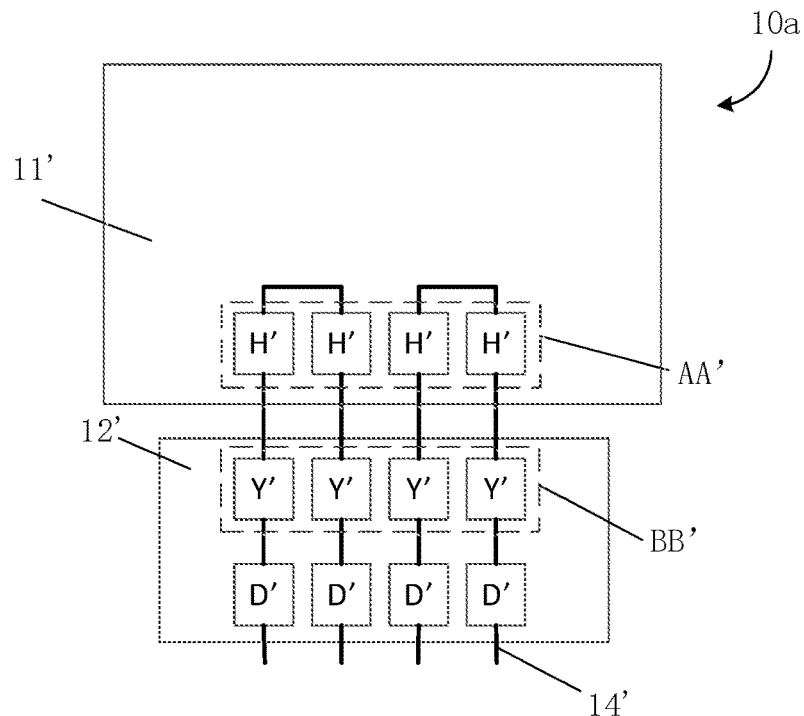
FIGS. 1a and 1b schematically show the structure of an electronic device including bonded parts in the related art.

It should be understood that the drawings are merely schematic illustrations of exemplary embodiments of the present disclosure, and therefore need not be drawn to scale. In addition, same or similar portions, parts and/or elements are indicated by same reference signs throughout the drawings.

DETAILED DESCRIPTION OF EMBODIMENTS

The exemplary embodiments of this disclosure will be described in detail with reference to the drawings. It should be understood that terms used herein are only intended for describing specified embodiments, rather than limiting the present disclosure. As used herein, singular forms of "an", "a" and "the" are intended to also comprise plural forms, unless explicitly indicated otherwise in the context. It should be further understood that when used in this disclosure, terms of "comprise" and/or "include" indicate the presence of the indicated features, entities, steps, operations, elements and/or parts, but does not exclude the presence of one or more other features, entities, steps, operations, elements, parts and/or groups thereof, or the addition of one or more other features, entities, steps, operations, elements, parts and/or groups thereof. Besides, the term of "and/or" used herein comprises any and all combination(s) of one or more of the items associated and listed.

It should be understood that although terms such as "first", "second", "third" and the like can be used herein for describing various elements, parts and/or portions, they should not limit these elements, parts and/or portions. These terms are only used for distinguishing one element, part and/or portion from another element, part or portion. Therefore, a first element, part or portion discussed below may also be referred to as a second or third element, part or portion without departing from the teaching of the present disclosure.

It should be understood that when an element is referred to as being "connected to another element" or "coupled to another element", the element can be connected to another element or coupled to another element directly or by means of an intermediate element. On the contrary, when an element is described as being "directly connected to another element" or "directly coupled to another element", there is no intermediate element. It should also be understood that in the present disclosure, when A and B are described as "A and B are in conduction", it should be understood that the electrical connection between A and B is realized, that is, the electrical signal can be transmitted between A and B. Correspondingly, when A and B are described as "breaking the conduction between A and B", it should be understood as breaking the electrical connection between A and B, that is, the electrical signal cannot be transmitted between A and B. In the above, A and B can be any suitable elements, parts, portions, ports, pins, pads or signal terminals, and the like.

Unless otherwise defined, all terms (including both technical terms and scientific terms) used herein have the same meaning as usually understood by one having ordinary skills in the art to which the present disclosure pertains. It should be further understood that terms such as those defined in a commonly used dictionary should be construed as having the same meanings as they do in the related art and/or in the context of this specification, and should not be construed in an ideal sense or an overly formal sense, unless explicitly defined so herein.

It should be noted that in the description of this specification, descriptions with reference to expressions such as "an embodiment", "some embodiments", "an exemplary embodiment", "a specific example" or "some examples" mean that specific features, structures, materials or characteristics described in combination with the embodiment(s) or example(s) are comprised in at least one embodiment or example of this disclosure. Therefore, schematic descriptions of the above expressions are not necessarily directed at the same embodiment(s) or example(s) herein. Moreover, the described specific features, structures, materials or characteristics can be combined in any one or more embodiments or examples in any suitable ways. Besides, where no contradiction is introduced, those skilled in the art can combine and assemble different exemplary embodiments or examples described in this specification, and can combine and assemble features of different exemplary embodiments or examples described in this specification.

It should be understood that the steps in the method described in the present disclosure are all exemplary, and they do not necessarily have to be performed in the order as listed, but one or more of these steps can be performed in a different order or at the same time according to actual conditions. In addition, according to actual conditions, the method described in the present disclosure may further include other additional steps.

For clarity, some techniques, structures and materials commonly known in the art to which the present disclosure pertains will not be described in detail so as to avoid redundancy and tediousness of the present application.

Figure 1B:
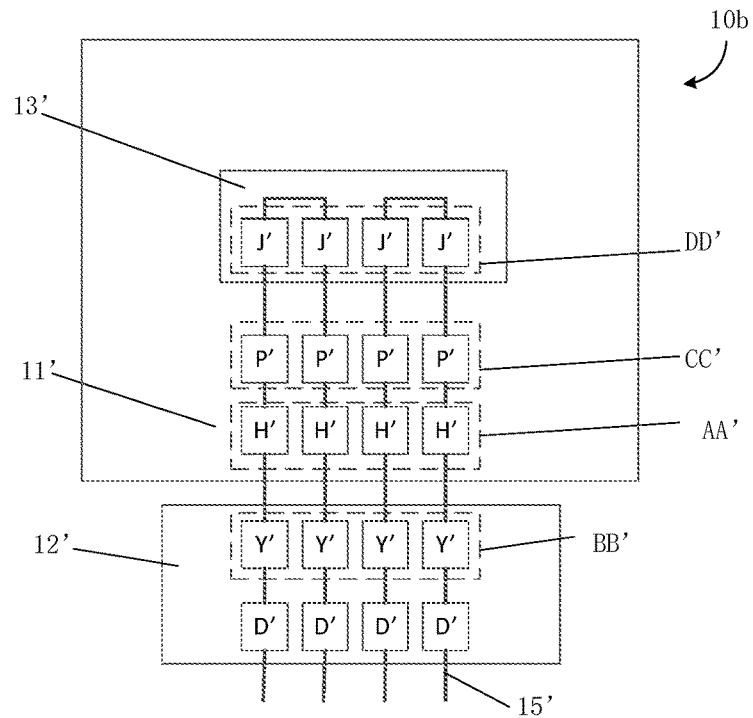

FIGS. 1a and 1b respectively schematically show the structure of an electronic device including bonded parts in the related art. As shown in FIG. 1a, the electronic device 10a includes a first part 11' and a second part 12'. A plurality of pads H' are provided in a first testing area AA' of the electronic device 11', and two pads H' are electrically connected to form an electrical path through which current can pass. As shown in FIG. 1a, each pad H' is only electrically connected with another pad H'. In a second testing area BB' of the second part 12' bonded to the first component 11', the pins Y' corresponding to the pads H' are provided. In addition, a plurality of testing terminals D' are also provided in the second testing area BB' of the second part 12'. When the first part 11' and the second part 12' are being bonded, the pad H' in the first testing area AA' is bonded to the corresponding pin Y' in the second testing area to form a bonding circuit. As shown in FIG. 1a, in the electronic device 10a, a detection circuit 14 is formed along the following order of testing terminals, pins and pads, i.e. D'-Y'-H'-H'-Y'-D'. In the related art, by detecting the resistance of the detection circuit 14' and determining whether the resistance meets a preset resistance threshold, it can be determined whether there is an abnormality in the bonding between the first part 11' and the second part 12'.

However, during the test process, there may be a phenomenon that the test result shows that the bonding is normal, but in fact the bonding between the first part 11' and the second part 12' is in an abnormal state. Therefore, the test process may have great errors and instability, such that it is impossible to determine whether there is an abnormality in the bonding between the first part 11' and the second part 12' in a timely and accurate manner.

Referring to FIG. 1b, it schematically shows the structure of another electronic device including bonded parts in the related art. As shown in FIG. 1b, in addition to the first part 11' and the second part 12', the electronic device 10b also includes a third part 13'. A plurality of pins J' are provided in a fourth testing area DD' of the third component 13'. Two pins J' are electrically connected to form a current channel through which current can pass. In addition, as shown in FIG. 1b, each pin J' is only electrically connected with another pin J'. A third testing area CC' of the first part 11' bonded to the third part 13' is provided with a plurality of pads P'. When the third part 13' is bonded to the first part 11', a testing pin J' and a corresponding pad P' are in a conductive state. At the same time, in the first part 11', the pads P' of the third testing area CC' and the pads H' of the first testing area AA' are also in a conductive state.

When performing the bonding between the third part 13' and the first part 11', the pins J' in the fourth testing area DD' of the third part 13' can be bonded with the corresponding pads P' in the third testing area CC' of the first part 11', and the third part 13' can be in conduction with the corresponding pins Y' in the second testing area BB' of the second part 12', thereby forming bonding circuits. As shown in FIG. 1b, in the electronic device 10b, a detection circuit 15' is formed along the following order of testing terminals, pins and pads, i.e. D'-Y'-H'-P'-J'-J'-P'-H'-Y'-D'. In the related art, it is possible to detect the resistance of the detection circuit 15' and determine whether the resistance meets the preset resistance threshold, thereby determining whether there is an abnormality in the bonding between the first part 11' and the third part 13'.

However, similar to the situation in which there may be great errors and instability during the test process of the detection circuit 14', the test results obtained by the detection circuit 15' may not be able to accurately determine whether the electronic device is abnormal, and in the case that there is an abnormality in the electronic device, it may also be impossible to determine whether the abnormality of the electronic device occurs in the bonding process of the second part or the bonding process of the third part. Therefore, the test process based on the detection circuit 15' may also have great errors and instability, and it may not be possible to determine whether the electronic device is abnormal in time and accurately.

As a non-limiting embodiment, in the embodiments shown in FIGS. 1a and 1b, the electronic devices 10a, 10b including bonded parts may be a display device, the first part 11' may be a display panel, and the second part 12' may be a flexible printed circuit (referred to as FPC hereinafter) board, and the third part 13' may be a driving chip. Therefore, as described above, in the related art, during the manufacturing process of a display device, generally speaking, only the overall circuit resistance(s) of the bonding areas of a display panel and a flexible printed circuit board and/or the bonding areas of a display panel and a driving chip can be detected. However, the detection method may have great errors and instability. At the same time, because the overall lines of the bonding areas involve many uncertain factors, it is difficult to locate the specific position at which the bonding abnormality occurs even if the detection method finds the bonding abnormality. Therefore, in actual manufacturing, this will greatly affect the production yield and production efficiency of a display device, and also cause waste of production costs.

However, it should be understood that the electronic devices 10a, 10b that include bonded parts in the embodiments shown in FIGS. 1a and 1b, as well as the first part 11', the second part 12', and the third part 13' included therein, are not limited to a display device, a display panel, an FPC board, and a driving chip, but can be any suitable electronic devices and electronic components that use the bonding process. As another non-limiting example, the first part 11', the second part 12', and the third part 13' may all include a bonding area, and therefore a bonding process can be used to achieve bonding connections, and at least one of the first part 11', the second part 12' and the third part 13' is a circuit board.

In order to solve the above-mentioned problems in the related art, the present disclosure proposes an electronic device including bonded parts and a method used for detecting the same.

Figure 2:
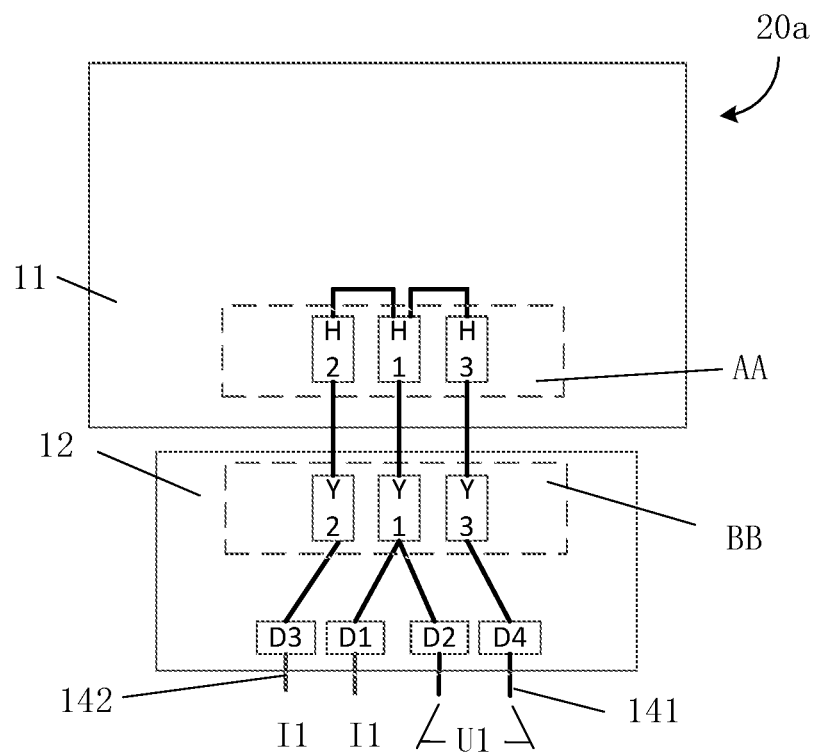
FIG. 2 schematically shows the structure of an electronic device including bonded parts according to an exemplary embodiment of the present disclosure.

Referring to FIG. 2, it schematically illustrates the structure of an electronic device including bonded parts according to an exemplary embodiment of the present disclosure. As shown in FIG. 2, the electronic device 20a includes a first part 11 and a second part 12 bonded to the first part 11. Specifically, the first part 11 includes a first bonding area for bonding the second part 12, the second part 12 includes a second bonding area, the second bonding area includes a plurality of testing terminals, and the second bonding area corresponds to the first bonding area of the first part 11.

The first bonding area of the first part 11 includes at least one first testing area AA, the first testing area AA includes a first testing pad H1, a second testing pad H2, and a third testing pad H3, and the first testing pad H1 is electrically connected with the second testing pad H2 and the third testing pad H3, respectively. Therefore, the three testing pads H1 to H3 of the first testing area AA form a testing pad group, and among the three testing pads, one testing pad is electrically connected with the other two testing pads, respectively. As shown in FIG. 2, in the first testing area AA of the first part 11, the first testing pad H1, the second testing pad H2, and the third testing pad H3 are three testing pads arranged in one row, wherein the first testing pad H1 is located between the second testing pad H2 and the third testing pad H3.

The second bonding area of the second part 12 includes at least one second testing area BB respectively corresponding to the at least one first testing area AA. Here, the expression "respectively corresponding" means that each testing area AA in the at least one first testing area AA corresponds to a corresponding testing area BB in the at least one second testing area BB. It should be understood that, in this specification, the expression "respectively corresponding" always refers to the one-to-one correspondence as described above, unless there is a clear different description. The second testing area BB includes a first testing pin Y1 that is bonded to the first testing pad H1, a second testing pin Y2 that is bonded to the second testing pad H2, and a third testing pin Y3 that is bonded to the third testing pad H3. Therefore, the three testing pins also form a testing pin group. Each testing pad and the corresponding testing pin form a bonding point, thereby forming a bonding connection between the first part 11 and the second part 12. When the bonding process is normal, the first part 11 and the second part 12 are in conduction at the bonding points.

As shown in FIG. 2, the second bonding area also includes a plurality of testing terminals, including at least a first testing terminal D1, a second testing terminal D2, a third testing terminal D3, and a fourth testing terminal D4. The first testing pin Y1 is electrically connected with the first testing terminal D1 and the second testing terminal D2, the second testing pin Y2 is electrically connected with the third testing terminal D3, and the third testing pin Y3 is electrically connected with the fourth testing terminal D4. It should be noted that, as a non-limiting example, the testing terminal described in the present disclosure may be an exposed metal pad that is in conduction with a corresponding testing pin, through which an electrical signal can be applied to the testing pin. It is also possible to measure the corresponding test pin(s) with test leads or probes through the metal pad(s). However, it should be understood that the testing terminal may also have any other suitable forms, for example, the testing terminal may also be a conductive via, and the like.

Therefore, in the electronic device 20a shown in FIG. 2, the first testing terminal D1, the first testing pin Y1, the first testing pad H1, the second testing pad H2, the second testing pin Y2, and the third testing terminal D3 can form a current channel 142, so that during the process of detecting the electronic device 20a (described in detail hereinafter), a constant current signal I1 can be applied through the first testing terminal D1 and the third testing terminal D3. In addition, the second testing terminal D2, the first testing pin Y1, the first testing pad H1, the third testing pad H3, the third testing pin Y3, and the fourth testing terminal D4 can form a voltage testing channel 141, so that during the process of detecting the electronic device 20a, a test voltage U1 can be obtained through the second testing terminal D2 and the fourth testing terminal D4.

Therefore, the electronic device 20a shown in FIG. 2 respectively forms a current channel and a voltage testing channel through four testing terminals and three testing pins. Based on the test voltage U1 measured by the voltage testing channel 141 and the constant current signal I1 in the current channel 142, the test resistance at the corresponding bonding point in the bonding connection between the first part 11 and the second part 12 can be accurately obtained. As shown in FIG. 2, since both the current channel 142 and the voltage testing channel 141 include a bonding point formed by the first testing pad H1 and the first testing pin Y1, the test resistance at the bonding point can be obtained. Based on the test resistance, for example, by comparing the test resistance with a preset resistance threshold, it is possible to accurately determine whether there is a circuit failure in the bonding connection of the first part 11 and the second part 12, so as to determine whether there is an abnormality in the bonding process of the first part 11 and the second part 12. As a non-limiting example, when the obtained test resistance of the first testing pad H1 and the first testing pin Y1 is less than or equal to the resistance threshold, the bonding connection of the first part 11 and the second part 12 is normal, that is, the first testing pad H1 and the first testing pin Y1, the second testing pad H2 and the second testing pin Y2, the third testing pad H3, and the third testing pin Y3 are all normal. In other words, there is no disconnection or misalignment problem at each bonding point. On the contrary, if the obtained resistance of the first testing pad H1 and the first testing pin Y1 is greater than the resistance threshold, the bonding connection of the first part 11 and the second part 12 is abnormal, and there is a disconnection or misalignment problem in the bonding points. As a result, the cause of the failure of the electronic device 20a can be found in time, thereby effectively improving its production efficiency and production yield, and thus has a wide range of application prospects.

In the exemplary embodiment shown in FIG. 2, the first testing terminal D1, the first testing pin Y1, the first testing pad H1, the second testing pad H2, the second testing pin Y2, and the third testing terminal D3 form the current channel 142, and the second testing terminal D2, the first testing pin Y1, the first testing pad H1, the third testing pad H3, the third testing pin Y3, and the fourth testing terminal D4 form the voltage test channel 141. However, it should be understood that other forms of the current channel and the voltage testing channel are also possible. For example, a current channel may also be formed through the second testing terminal D2, the first testing pin Y1, the first testing pad H1, the third testing pad H3, the third testing pin Y3, and the fourth testing terminal D4, and a voltage test channel may be formed through the first testing terminal D1, the first testing pin Y1, the first testing pad H1, the second testing pad H2, the second testing pin Y2, and the third testing terminal D3. In addition, a current channel may also be formed through the first testing terminal D1, the first testing pin Y1, the first testing pad H1, the third testing pad H3, the third testing pin Y3, and the fourth testing terminal D4, and a voltage test channel may be formed through the second testing terminal D2, the first testing pin Y1, the first testing pad H1, the second testing pad H2, the second testing pin Y2, and the third testing terminal D3. In addition, a current channel may also be formed through the second testing terminal D2, the first testing pin Y1, the first testing pad H1, the second testing pad H2, the second testing pin Y2, and the third testing terminal D3, and a voltage test channel may be formed through the first testing terminal D1, the first testing pin Y1, the first testing pad H1, the third testing pad H3, the third testing pin Y3, and the fourth testing terminal D4. It should be understood that those skilled in the art can select appropriate current channels and voltage testing channels according to actual requirements. The present disclosure does not limit how to select specific current channels and voltage testing channels.

Figure 3:
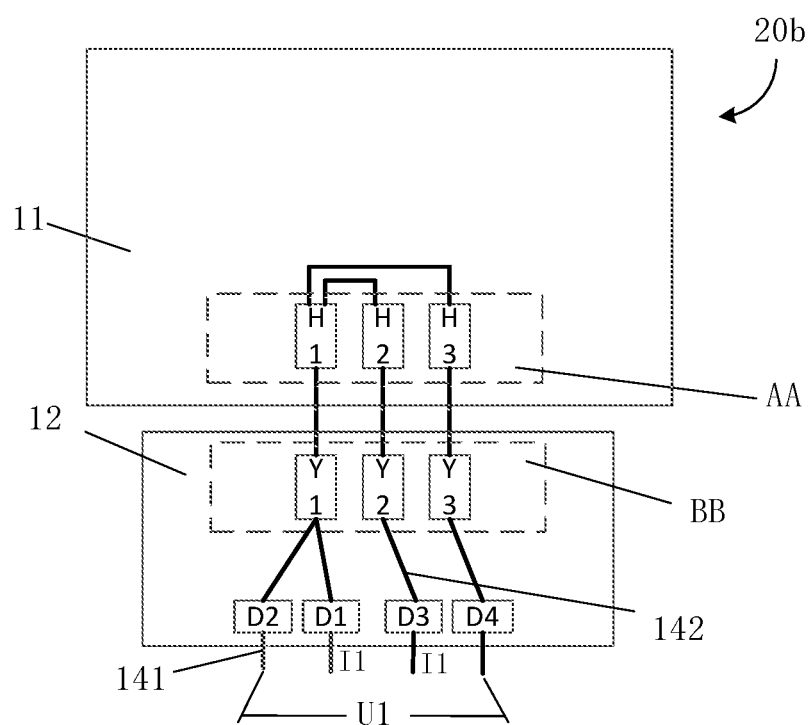
FIG. 3 schematically shows the structure of an electronic device including bonded parts according to another exemplary embodiment of the present disclosure.

It should also be understood that the arrangement sequence of the testing pads H1 to H3 may not be limited to the form shown in FIG. 2. Referring to FIG. 3, it schematically illustrates the structure of an electronic device including bonded parts according to another exemplary embodiment of the present disclosure. The electronic device 20b shown in FIG. 3 is similar in structure to the electronic device 20a shown in FIG. 2 except that the testing pads, testing pins, and testing terminals are arranged in a different sequence. As shown in FIG. 3, the first testing pad H1, the second testing pad H2, and the third testing pad H3 are three testing pads arranged in sequence from left to right, and the second testing pad H2 is located between the other two testing pads. In this arrangement sequence of the testing pads, the first testing pad H1 is still electrically connected with the second testing pad H2 and the third testing pad H3, respectively. The testing pins of the second part 12 are also arranged in one row from left to right, that is, the first testing pin Y1, the second testing pin Y2, and the third testing pin Y3. In this situation, the first testing pin Y1 is still electrically connected with the adjacent first and second testing terminals D1 and D2, the second testing pin Y2 is electrically connected with the third testing terminal D3, and the third testing pin Y3 is electrically connected with the fourth testing terminal D4. Therefore, the arrangement sequence of the testing terminals shown in FIG. 3 is: the second testing terminal D2, the first testing terminal D1, the third testing terminal D3, and the fourth testing terminal D4.

It should be understood that the present disclosure is not intended to impose any limitation on the arrangement sequences of testing pads, testing pins and testing terminals. On the contrary, based on the teachings of the present disclosure, those skilled in the art can appreciate that as long as the three testing pads correspond to the three testing pins one-to-one, one of the testing pads is electrically connected with the other two testing pads and is bonded to the testing pin that is electrically connected with two testing terminals, an electronic device with such a structure is an electronic device falling within the scope of the present disclosure. As for the specific arrangement sequences of testing pads, testing pins and testing terminals, those skilled in the art can make settings according to actual application requirements, as long as the above structure can be realized to form two testing circuits passing through the same bonding point. Regarding the specific arrangement sequences of testing pads, testing pins and testing terminals, the present disclosure does not impose any limitation.

Continually referring to FIG. 3, in this exemplary embodiment, the constant current signal I1 is input from the first testing terminal D1, and sequentially passes through the first testing pin Y1, the first testing pad H1, the second testing pad H2, and the second testing pin Y2 and the third testing terminal D3, thereby forming the current channel 142. The second testing terminal D2 and the fourth testing terminal D4 can be used for testing voltage, therefore, the second testing terminal D2, the first testing pin Y1, the first testing pad H1, the third testing pad H3, the third testing pin Y3 and the fourth testing terminal D4 form the voltage testing channel 141. Through the voltage testing channel 141, the test voltage U1 can be obtained. According to the test voltage U1 and the constant current signal I1, the test resistance of the bonding point formed by the first testing pad H1 and the first testing pin Y1 can be obtained. By comparing the test resistance with the preset resistance threshold, it can be accurately and intuitively determined whether the bonding connection between the first part 11 and the second part 12 is normal, so that abnormalities that may occur in the bonding process can be found in time. As a result, it is possible to improve the detection accuracy of determining the circuit failures in the electronic device 20b.

Similar to the exemplary embodiment shown in FIG. 2, the voltage testing channel 141 and the current channel 142 in the exemplary embodiment shown in FIG. 3 are also only exemplary and not restrictive. Therefore, other forms of current channels and voltage testing channels are also possible. The present disclosure does not impose any limitation on how to select a current channel and a voltage testing channel. Those skilled in the art can make settings according to actual application requirements, as long as the test resistance at the bonding point of the first part and the second part can be measured through the voltage testing channel and the current channel.

As a non-limiting example, the detection process of the electronic device 20a shown in FIG. 2 will be described below. In this example, the arrangement sequence of the three testing pads in the first testing area AA is as shown in FIG. 2, and the detection process includes:

applying the constant current signal I1 through the first testing terminal D1 and the third testing terminal D3;

using the second testing terminal D2 and the fourth testing terminal D4 to obtain the test voltage U1 through the voltage testing channel 141;

obtaining the test resistance based on the test voltage U1 and the constant current signal I1;

determining whether the test resistance meets the preset resistance threshold.

Since both the current channel 142 and the voltage testing channel 141 include the bonding point formed by the first testing pad H1 and the first testing pin Y1, when the constant current signal I1 is known, the accurate test resistance at the bonding point can be obtained by obtaining the test voltage U1 between the two testing terminals of the voltage testing channel 141. When the test resistance at the bonding point formed by the first testing pad H1 and the first testing pin Y1 is less than or equal to the preset resistance threshold, the bonding connection between the first part 11 and the second part 12 is normal. There is no disconnection or misalignment problem in each bonding point. If the obtained test resistance at the bonding point formed by the first testing pad H1 and the first testing pin Y1 is greater than the resistance threshold, it means that the testing pads H1~H3 in the first testing area AA fail to form an effective bonding connection with the testing pins Y1~Y3 in the second testing area BB, and there is a problem of bonding misalignment or disconnection at the bonding point during the bonding process of the first part 11 and the second part 12. As a result, the electronic device 20a needs to be repaired in time.

Figure 6:
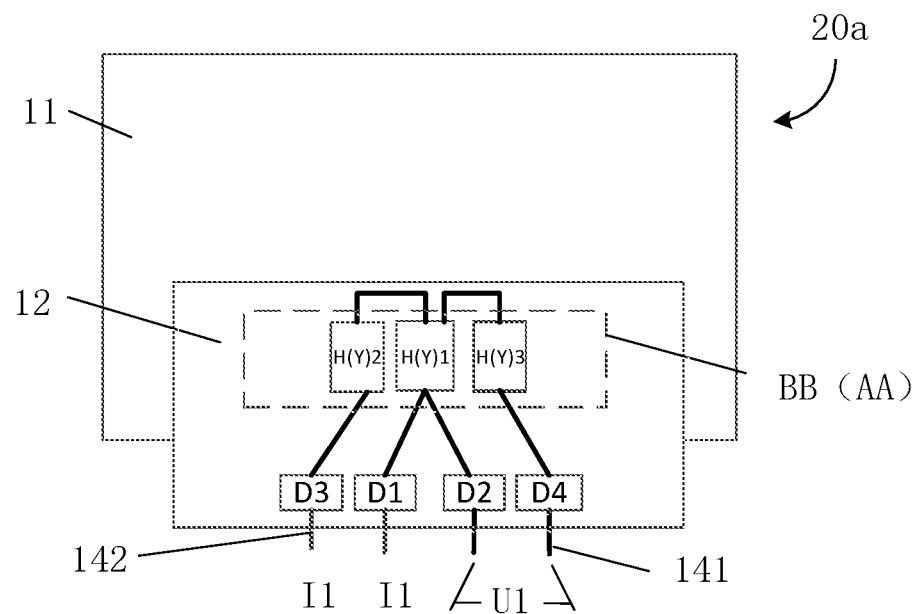
FIG. 6 schematically shows the bonding structure formed by the bonded parts of the electronic device shown in FIG. 2.

According to the exemplary embodiments of the present disclosure, four testing terminals and three testing pins respectively form a current channel and a voltage testing channel which are both conductive, and the test resistance at the bonding point can be accurately obtained based on the test voltage measured through the voltage testing channel and the constant current in the current channel. Based on the test resistance, it can be accurately determined whether there is a failure in the bonding connection, and whether the bonding process between the various parts of the electronic device is normal, so as to find the cause of the electronic device being defective in time, thereby effectively improving the production efficiency and the production yield, and thus having a wide range of application prospects. It should be noted that the connection lines between the testing pads H1 to H3 and the testing pins Y1 to Y3 shown in FIG. 2 and FIG. 3 are the bonding points formed after the actual bonding process. Referring to FIG. 6, it schematically shows the bonding structure of the bonded parts in the electronic device shown in FIG. 2. As shown in FIG. 6, when the first part 11 is bonded with the second part 12, the first testing area AA overlaps the second testing area BB, and the first testing pad H1 and the corresponding first testing pin Y1 form a bonding point H(Y)1, the second testing pad H2 and the corresponding second testing pin Y2 form a bonding point H(Y)2, the third testing pad H3 and the corresponding third testing pin Y3 form bonding point H(Y)3. At this time, the current channel 142 and the voltage testing channel 141 for testing can be formed through three bonding points and four testing terminals, wherein the current channel 142 is D1-H(Y)1 bonding Y1 and H1-H(Y)2 bonding Y2 and H2-D3, the voltage testing channel 141 is D2-H(Y)1 bonding Y1 and H1-H(Y)3 bonding Y3 and H3-D4.

It should be understood that the electronic devices 20a, 20b including bonded parts as well as the first part 11 and the second part 12 included therein, of the exemplary embodiments shown in FIG. 2 and FIG. 3, may be any suitable electronic devices and electronic parts using the bonding process to realize bonding connections. As a non-limiting example, the electronic devices 20a, 20b may be a display device, the first part 11 may be a display panel, and the second part 12 may be an FPC board. Using the bonding process, the FPC board can be bonded on the display panel to form an FOP (FPC On Panel) circuit. As another non-limiting embodiment, both the first part 11 and the second part 12 include a bonding area, and therefore the bonding process can be used to achieve bonding connections, and at least one of the first part 11 and the second part 12 is a circuit board. It should also be understood that those skilled in the art can select the number of the first testing area and the second testing area in the electronic device according to the exemplary embodiment of the present disclosure based on actual applications, which is not limited in the present disclosure.

Figure 4:
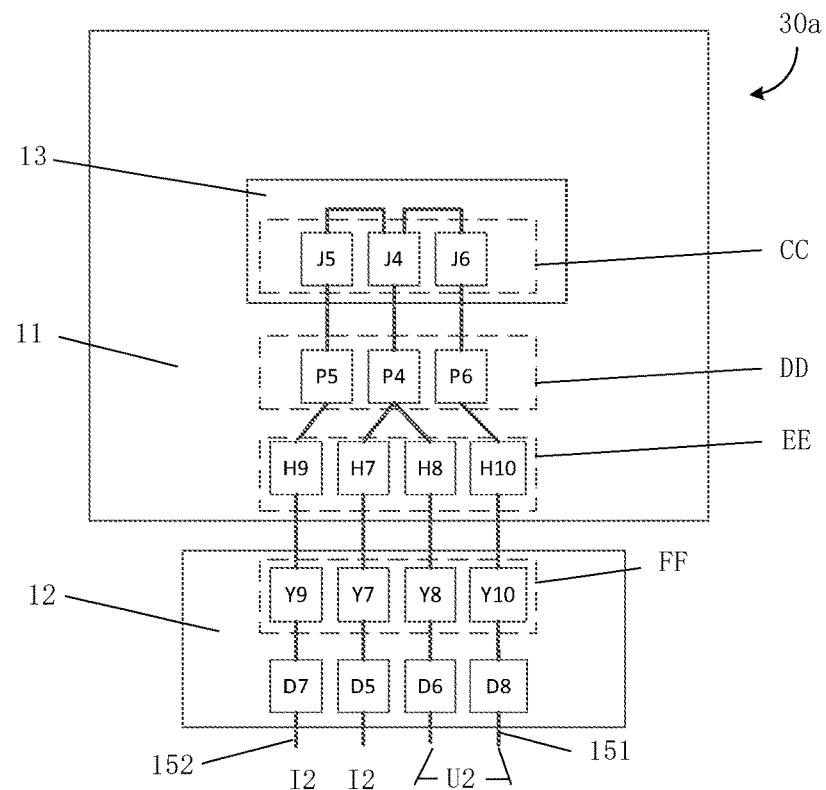
FIG. 4 schematically shows the structure of an electronic device including bonded parts according to another exemplary embodiment of the present disclosure.

Referring to FIG. 4, it schematically illustrates the structure of an electronic device including bonded parts according to another exemplary embodiment of the present disclosure. As shown in FIG. 4, in addition to the first part 11 and the second part 12, the electronic device 30a also includes a third part 13. Therefore, during the manufacturing process of the electronic device 30a, it is also necessary to detect whether the bonding connection between the first part 11 and the third part 13 is normal. The third part 13 of the electronic device 30a includes a third bonding area for bonding with the first part 11, and the first part 11 further includes a fourth bonding area corresponding to the third bonding area of the third part 13.

The third bonding area of the third part 13 includes at least one third testing area CC, the third testing area CC includes a fourth testing pin J4, a fifth testing pin J5, and a sixth testing pin J6, and the fourth testing pin J4 is electrically connected with both the fifth testing pin J5 and the sixth testing pin J6. As shown in FIG. 4, in the third testing area CC, the fourth testing pin J4, the fifth testing pin J5, and the sixth testing pin J6 are three test pins which are arranged in one row, wherein the fourth test pin J4 is located between the fifth testing pin J5 and the sixth testing pin J6. Therefore, the fourth testing pin J4, the fifth testing pin J5, and the sixth testing pin J6 form a testing pin group.

The fourth bonding area of the first part 11 includes at least one fourth testing area DD respectively corresponding to the at least one third testing area, and the fourth testing area DD includes a fourth testing pad P4 bonded to the fourth testing pin J4, the fifth testing pad P5 bonded to the fifth testing pin J5, and the sixth testing pad P6 bonded to the sixth testing pin J6. Correspondingly, in the fourth testing area DD of the first part 11, the testing pad bonded to the fifth testing pin J5 is the fifth testing pad P5, and the testing pad bonded to the fourth testing pin J4 is the fourth testing pad P4, and the testing pad bonded to the sixth testing pin J6 is the sixth testing pad P6. Therefore, these three testing pads also form a testing pad group. Each testing pad and the corresponding testing pin form a bonding point. When the bonding process is normal, the first part 11 and the third part 13 are in conduction at the bonding points.

The first part 11 further includes a fifth bonding area corresponding to the fourth bonding area, the fifth bonding area includes at least one fifth testing area EE respectively corresponding to the at least one fourth testing area, and the fifth testing area EE includes the seventh testing pad H7 and the eighth testing pad H8 both electrically connected with the fourth testing pad P4, the ninth testing pad H9 electrically connected with the fifth testing pad P5, and the tenth testing pad H10 electrically connected with the sixth testing pad P6.

The second part 12 further includes a sixth bonding area corresponding to the fifth bonding area of the first part 11, and the sixth bonding area includes at least one sixth testing area FF respectively corresponding to the at least one fifth testing area EE. The sixth testing area FF includes a seventh testing pin Y7 bonded to the seventh testing pad H7, an eighth testing pin Y8 bonded to the eighth testing pad H8, and a ninth testing pin Y9 bonded to the ninth test pad H9, a tenth testing pin Y10 bonded to the tenth testing pad H10, and the sixth bonding area further includes a plurality of testing terminals. The plurality of testing terminals includes at least a fifth testing terminal D5, the sixth testing terminal D6, the seventh testing terminal D7, and the eighth testing terminal D8, and the seventh testing pin Y7 is electrically connected to the fifth testing terminal D5, and the eighth testing pin Y8 is electrically connected to the sixth testing terminal D6, the ninth testing pin Y9 is electrically connected to the seventh testing terminal D7, and the tenth testing pin Y10 is electrically connected to the eighth testing terminal D8. It should be noted that, as a non-limiting example, the testing terminal described in the present disclosure may be an exposed metal pad in conduction with a corresponding testing pin, through which electrical signals can be applied to the testing pin. It is also possible to measure the corresponding test pin(s) with test leads or probes through the metal pad(s). However, it should be understood that the testing terminal may also have any other suitable forms, for example, the testing terminal may also be a conductive via, and the like.

Therefore, in the electronic device 30a shown in FIG. 4, the fifth testing terminal D5, the seventh testing pin Y7, the seventh testing pad H7, the fourth testing pad P4, the fourth testing pin J4, and the fifth testing the pin J5, the fifth testing pad P5, the ninth testing pad H9, the ninth testing pin Y9, and the seventh testing terminal D7 form a current channel 152, so that in the process of detecting the electronic device 30a (described in detail hereinafter), a constant current signal 12 can be applied through the fifth testing terminal D5 and the seventh testing terminal D7. The sixth testing terminal D6, the eighth testing pin Y8, the eighth testing pad H8, and the fourth testing pad P4, the fourth testing pin J4, the sixth testing pin J6, the sixth testing pad P6, the tenth testing pad H10, the tenth testing pin Y10 and the eighth testing terminal D8 form a voltage testing channel 151, so that in the process of detecting the electronic device 30a, a test voltage U2 can be obtained through the sixth testing terminal D6 and the eighth testing terminal D8.

In the exemplary embodiment shown in FIG. 4, a current channel and a voltage test channel, which are both conductive, can be respectively formed through the four testing pads of the fifth testing area EE, the four testing pins of the sixth testing area FF, the four testing terminals of the sixth bonding area, the three testing pads of the fourth testing area DD and the three testing pins of the third test area CC. The test resistance at a corresponding bonding point can be accurately determined by the test voltage measured through the voltage testing channel and the constant current in the current channel. Specifically, since both the current channel 152 and the voltage testing channel 151 include a bonding point formed by the fourth testing pad P4 and the fourth testing pin J4, the test resistance at the bonding point can be determined. Through this test resistance, it can be determined whether there is a circuit failure in the bonding connection of the first part 11 and the third part 13, and thus whether an abnormality exists in the bonding process of the first part 11 and the third part 13, so as to find the cause of the failure of the electronic device 30a in time, and to avoid the problem of inaccurately locating the abnormality due to misjudgment, such that the production efficiency and the manufacturing yield of the electronic device 30a can be effectively improved.

Specifically, when the obtained test resistance at the bonding point formed by the fourth testing pad P4 and the fourth testing pin J4 is less than or equal to a preset resistance threshold, the bonding connection between the first part 11 and the third part 13 is normal, and there is no disconnection or misalignment at each bonding point. If the obtained test resistance at the bonding point formed by the fourth testing pad P4 and the fourth testing pin J4 is greater than the preset resistance threshold, the bonding connection between the first part 11 and the third part 13 is abnormal, and there is a problem of disconnection or misalignment at each bonding point.

In the exemplary embodiment shown in FIG. 4, the fifth testing terminal D5, the seventh testing pin Y7, the seventh testing pad H7, the fourth testing pad P4, the fourth testing pin J4, the fifth testing pin J5, the fifth testing pad P5, the ninth testing pad H9, the ninth testing pin Y9, and the seventh testing terminal D7 form the current channel 152; the sixth testing terminal D6, the eighth testing pin Y8, the eighth testing pad H8, the fourth testing pad P4, the fourth testing pin J4, the sixth testing pin J6, the sixth testing pad P6, the tenth testing pad H10, the tenth testing pin Y10 and the eighth testing terminal D8 form the voltage testing channel 151. However, it should be understood that other forms of current channels and voltage testing channels are also possible. For example, the sixth testing terminal D6, the eighth testing pin Y8, the eighth testing pad H8, the fourth testing pad P4, the fourth testing pin J4, the sixth testing pin J6, the sixth testing pad P6, the tenth testing pad H10, the tenth testing pin Y10, and the eighth testing terminal D8 can also form a current channel. At this time, the fifth testing terminal D5, the seventh testing pin Y7, the seventh testing pad H7, the fourth testing pad P4, the fourth testing pin J4, the fifth testing pin J5, the fifth testing pad P5, the ninth testing pad H9, the ninth testing pin Y9 and the seventh testing terminal D7 form a voltage testing channel. In addition, the fifth testing terminal D5, the seventh testing pin Y7, the seventh testing pad H7, the fourth testing pad P4, the fourth testing pin J4, the sixth testing pin J6, and the sixth testing pad P6, the tenth testing pad H10, the tenth testing pin Y10, and the eighth testing terminal D8 form a current channel. At this time, the sixth testing terminal D6, the eighth testing pin Y8, and the eighth testing pad H8, the fourth testing pad P4, the fourth testing pin J4, the fifth testing pin J5, the fifth testing pad P5, the ninth testing pad H9, the ninth testing pin Y9 and the seventh testing terminal D7 form a voltage testing channel. In addition, the sixth testing terminal D6, the eighth testing pin Y8, the eighth testing pad H8, the fourth testing pad P4, the fourth testing pin J4, the fifth testing pin J5, the fifth testing pad P5, the ninth testing pad H9, the ninth testing pin Y9, and the seventh testing terminal D7 form a current channel. At this time, the fifth testing terminal D5, the seventh testing pin Y7, and the seventh testing pad H7, the fourth testing pad P4, the fourth testing pin J4, the sixth testing pin J6, the sixth testing pad P6, the tenth testing pad H10, the tenth testing pin Y10, and the eighth testing terminal D8 form a voltage testing channel. The present disclosure does not limit how to select a current channel and a voltage test channel.

Figure 5:
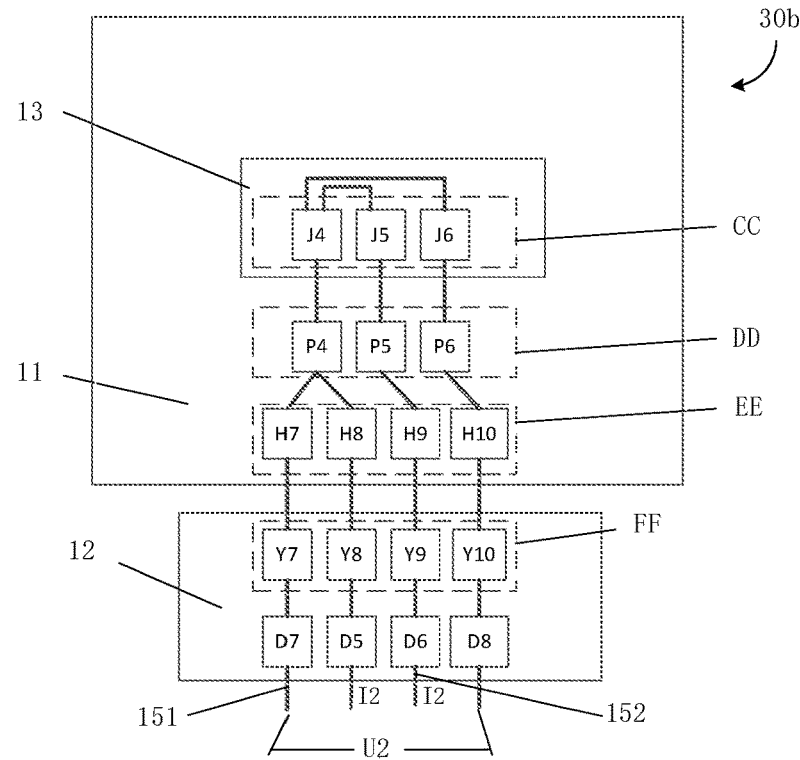
FIG. 5 schematically shows the structure of an electronic device including bonded parts according to another exemplary embodiment of the present disclosure.

It should be understood that the arrangement sequence of the testing pins J4 to J6 may not be limited to the form shown in FIG. 4. Referring to FIG. 5, it schematically illustrates the structure of an electronic device including bonded parts according to another exemplary embodiment of the present disclosure. The electronic device 30b shown in FIG. 5 is similar in structure to the electronic device 30a shown in FIG. 4, except that testing pads, testing pins, and testing terminals are arranged in a different sequence. As shown in FIG. 5, the fourth testing pin J4, the fifth testing pin J5, and the sixth testing pin J6 are three testing pins which are arranged in one row from left to right, and the fifth testing pin J5 is located between the other two testing pins. In this arrangement sequence of the testing pins, the fourth testing pin J4 is still electrically connected with the fifth testing pin J5 and the sixth testing pin J6, respectively.

Correspondingly, as shown in FIG. 5, the testing pads P4 to P6 of the fourth testing area DD of the first part 11 are also arranged in one row from left to right, that is, the fourth testing pad P4, the fifth testing Pad P5 and the sixth testing pad P6. In addition, the fourth testing pad P4 is still electrically connected with the seventh testing pad H7 and the eighth testing pad H8 in the fifth testing area EE of the first part 11, the testing pad P5 bonded to the fifth testing pin J5 is still electrically connected with the ninth testing pad H9, and the testing pad P6 bonded to the sixth testing pin J6 is still electrically connected with the tenth testing pad H10. Thus, the three testing pads P4 to P6 in the fourth testing area DD and the four testing pads H7 to H10 in the fifth testing area EE form four conductive lines.

In the sixth testing area FF of the second component 12, the testing pins Y7 to Y10 in the sixth testing area FF are respectively bonded to the corresponding testing pads H7 to H10, and thereby realizing conduction. The plurality of testing terminals D5 to D8 on the second part 12 are respectively in conduction with the corresponding testing pins Y7 to Y10, so as to form the testing channels that can be used for the detection of the electronic device 30b together with the testing pads in the fourth testing area DD and the testing pins in the third testing area CC, wherein one testing channel is the current channel 152 and the other one is the voltage testing channel 151.

It should be understood that the present disclosure does not impose any limitations on the arrangement sequence of testing pads, testing pins and testing terminals. Those skilled in the art can make settings according to actual application requirements, as long as the above-mentioned current channel and voltage testing channel can be implemented to measure the test resistance at the bonding point of the first part 11 and the third part 13.

As a non-limiting example, the detection process of the electronic device 30a shown in FIG. 4 will be described hereinafter. In this example, the arrangement sequence of the three testing pins in the third testing area CC is as shown in FIG. 4. The detection process includes:

applying the constant current signal 12 through the fifth testing terminal D5 and the seventh testing terminal D7;

using the sixth testing terminal D6 and the eighth testing terminal D8 to obtain the test voltage U2 through the voltage testing channel 151;

obtaining the test resistance based on the test voltage U2 and the constant current signal 12;

determining whether the test resistance meets the preset resistance threshold.

Since both the current channel 152 and the voltage testing channel 151 include the bonding point formed by the fourth testing pad P4 and the fourth testing pin J4, when the constant current signal 12 is known, the test resistance at the bonding point can be accurately obtained by obtaining the test voltage U2 between the two testing terminals of the voltage testing channel 151. When the obtained test resistance of the fourth testing pad P4 and the fourth testing pin J4 is less than or equal to the preset resistance threshold, the bonding connection between the first part 11 and the second part 13 is normal, and there is no problem of disconnection or misalignment at each bonding point. If the obtained test resistance of the fourth testing pad P4 and the fourth testing pin J4 is greater than the preset resistance threshold, it indicates that the testing pads P4 to P6 in the fourth testing area DD fail to form effective bonding with the testing pins J4 to J6 in the third testing area CC, and the problem of bonding misalignment or disconnection at the bonding point occurs in the bonding process of the first part 11 and the third part 13, such that the current electronic device 30a needs to be repaired in time.

According to an exemplary embodiment of the present disclosure, the current channel and the voltage testing channel, which are both conductive, may be formed through the four testing pads of the fifth testing area EE and the three testing pads of the fourth testing area DD, the test voltage is obtained by using the voltage testing channel, and the constant current in the current channel is known, such that the test resistance at the bonding point can be accurately determined. Based on the test resistance, it can be accurately determined whether a fault exists in the bonding connection between the first part 11 and the third part 13, so as to determine whether the bonding process is normal, and thereby finding the cause of the electronic device being defective, such that the production efficiency and the production yield can be effectively improved.

Figure 7:
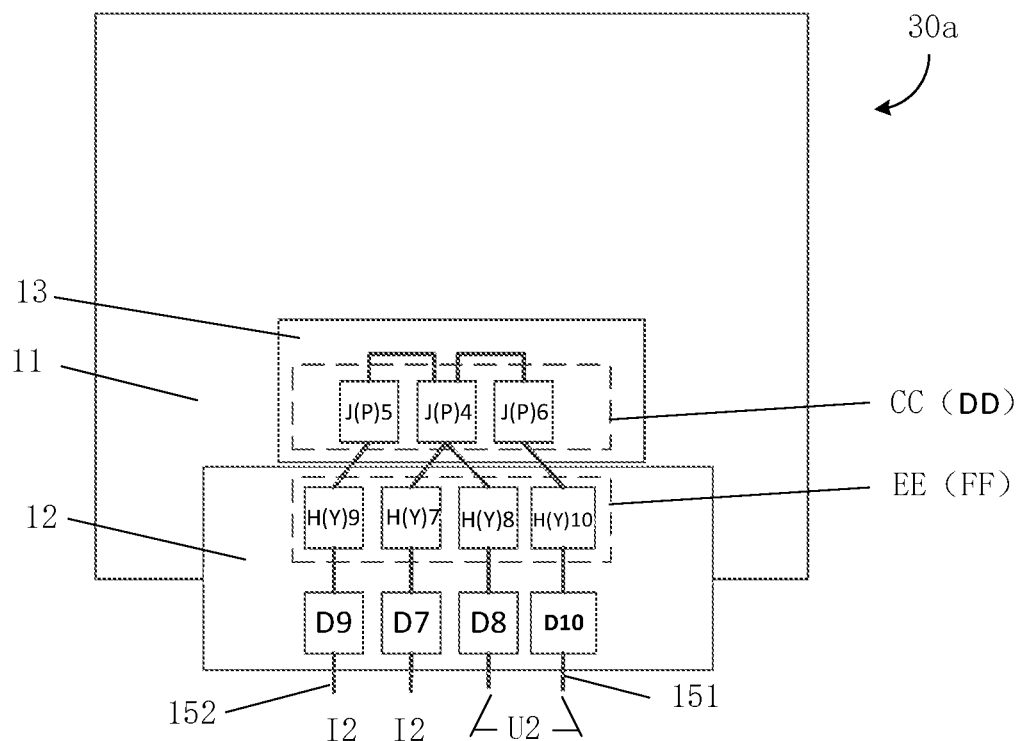
FIG. 7 schematically shows the bonding structure formed by the bonded parts of the electronic device shown in FIG. 4.

It should be noted that the connection lines between the testing pads P4 to P6 and the testing pins J4 to J6 shown in FIG. 4 and FIG. 5 are the bonding points formed after the actual bonding process. Referring to FIG. 7, it schematically shows the bonding structure of the bonded parts in the electronic device shown in FIG. 4. As shown in FIG. 7, when the first part 11 and the third part 13 are bonded to each other, and the first part 11 and the second part 12 are also bonded to each other, the fifth testing area EE and the sixth testing area FF overlap, the seventh testing pad H7 and the corresponding seventh testing pin Y7 form a bonding point H(Y)7, the eighth testing pad H8 and the corresponding eighth testing pin Y8 form a bonding point H(Y)8, the ninth testing pad H9 and the corresponding ninth testing pin Y9 form a bonding point H(Y)9, and the tenth testing pad H10 and the corresponding tenth testing pin Y10 form a bonding point H(Y)10; the third testing area CC overlaps with the fourth testing area DD, the fourth testing pad P4 and the corresponding fourth testing pin J4 form a bonding point J(P)4, the fifth testing pad P5 and the corresponding fifth the testing pin J5 forms a bonding point J(P)5, and the sixth testing pad P6 and the corresponding sixth testing pin J6 form a bonding point J(P)6. At this time, the three bonding points J(P)4 to J(P)6 of the first part 11 and the third part 13, and the four bonding points H(Y) 7 to H(Y)10 of the first part 11 and the second part 12 can form the current channel 152 and the voltage test channel 151 for testing, wherein the current channel 152 includes D5-H(Y)7-J(P)4-J(P)5-H(Y)9-D7, the voltage testing channel 151 includes D6-H(Y)8-J(P)4-J(P)6-H(Y)10-D8.

It should be understood that the electronic devices 30a, 30b including bonded parts as well as the first part 11, the second part 12, and the third part 13 included therein, of the exemplary embodiments shown in FIGS. 4 and 5, may be any suitable electronic devices and electronic parts that realize the bonding connection by the bonding process. As a non-limiting example, the electronic devices 30a, 30b may be a display device, the first part 11 may be a display panel, the second part 12 may be an FPC board, and the third part 13 may be a driving chip. Using the bonding process, the FPC board can be bonded on the display panel to form an FOP (FPC On Panel) circuit, and the driving chip can also be bonded on the display panel to form a COP (COF On Panel) circuit. As another non-limiting embodiment, the first part 11, the second part 12, and the third part 13 each include a bonding area, and therefore the bonding process can be used to realize the bonding connection, and at least one of the first part 11, the second part 12 and third part 13 is a circuit board. It should also be understood that those skilled in the art can determine the number of the third, fourth, fifth and sixth testing areas in the electronic device according to the exemplary embodiment of the present disclosure according to actual applications, which is not limited in the present disclosure.

Figure 8:
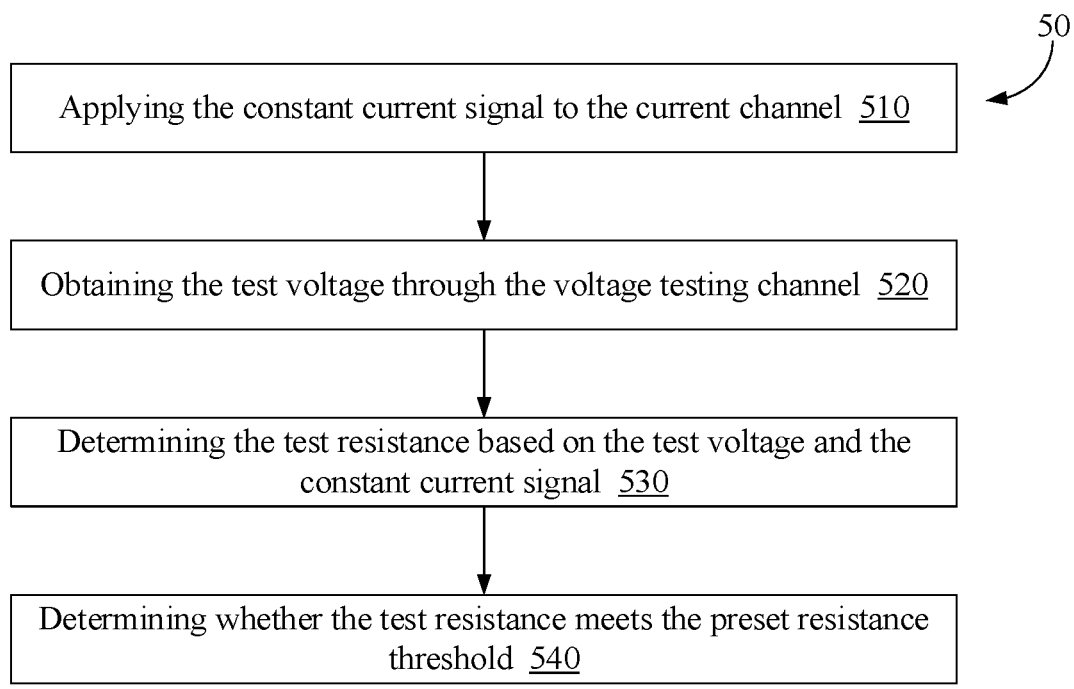
FIG. 8 schematically shows a method according to an exemplary embodiment of the present disclosure in the form of a flowchart, and the method may be used for detecting the electronic device according to the present disclosure.

Referring to FIG. 8, it schematically shows a method according to an exemplary embodiment of the present disclosure in the form of a flowchart, and the method may be used to detect an electronic device according to each exemplary embodiment of the present disclosure. As shown in FIG. 8, the method 50 includes the following steps:

step 510: applying the constant current signal to the current channel;

step 520: obtaining the test voltage through the voltage testing channel;

step 530: determining the test resistance based on the test voltage and the constant current signal;

step 540: determining whether the test resistance meets the preset resistance threshold.

As mentioned hereinabove, the method 50 shown in FIG. 8 can be used to detect electronic devices according to various exemplary embodiments of the present disclosure, for example, detecting the electronic devices 20a, 20b, 30a, 30b shown in FIGS. 2 to 5. Therefore, when the method 50 is used to detect the electronic devices 20a, 20b shown in FIG. 2 and FIG. 3, step 510 can be implemented as applying the constant current signal to the current channel 142, and accordingly, step 520 can be implemented as obtaining the test voltage through the voltage testing channel 141. In this case, regarding step 540, as a non-limiting example, when the obtained test resistance is less than or equal to the preset resistance threshold, the bonding connection between the first part 11 and the second part 12 is normal, and there is no problem of disconnection or misalignment at each bonding point. If the obtained test resistance is greater than the preset resistance threshold, it means that the testing pads in the first testing area AA fails to form an effective bonding with the testing pins in the second testing area BB, and the problem of bonding misalignment or disconnection at the bonding point occurs in the bonding process of the first part 11 and the second part 12, such that the current electronic device needs to be repaired in time.

In addition, when the method 50 is used to detect the electronic devices 30a and 30b shown in FIG. 4 and FIG. 5, step 510 can be implemented as applying the constant current signal to the current channel 152, and accordingly, step 520 can be implemented as obtaining the test voltage through the voltage testing channel 151. In this case, regarding step 540, as a non-limiting example, when the obtained test resistance is less than or equal to the preset resistance threshold, the bonding connection between the first part 11 and the third part 13 is normal, and there is no problem of disconnection or misalignment at each bonding point. If the obtained test resistance is greater than the preset resistance threshold, it means that the testing pins in the third testing area CC fails to form an effective bonding with the testing pads in the fourth testing area DD, and the problem of bonding misalignment or disconnection at the bonding point occurs in the bonding process of the first part 11 and the third part 13, such that the current electronic device needs to be repaired in time.

In addition, as described in detail hereinabove, the present disclosure does not intend to limit the current channel and the voltage testing channel to the current channels 142, 152 and the corresponding voltage testing channels 141, 151 as shown in FIGS. 2 to 5, respectively, but according to actual requirements, any suitable current channel and voltage test channel can be selected. Therefore, it should be understood that, in the above situation, when the method 50 is used to detect the electronic devices 20a, 20b shown in FIG. 2 and FIG. 3, step 510 can also be implemented as applying the constant current signal through the first testing terminal D1 and the third testing terminal D3, or through the second testing terminal D2 and the fourth testing terminal D4, or through the first testing terminal D1 and the fourth testing terminal D4, or through the second testing terminal D2 and the third testing terminal D3. Accordingly, step 520 can be implemented as obtaining a test voltage from two of four testing terminals of the second bonding area, which are not used for applying the constant current signal. And it should also be understood that in this case, when the method 50 is used to detect the electronic devices 30a and 30b shown in FIG. 4 and FIG. 5, step 510 can be implemented as applying the constant current signal through the seventh testing terminal D7 and the fifth testing terminal D5, or through the sixth testing terminal D6 and the eighth testing terminal D8, or through the seventh testing terminal D7 and the sixth testing terminal D6, or through the fifth testing terminal D5 and the eighth testing terminal D8. Accordingly, step 520 can be implemented as obtaining a test voltage from two of four testing terminals of the sixth bonding area, which are not used for applying the constant current signal.

When the method 50 according to the exemplary embodiment of the present disclosure is used to detect the electronic devices 20a, 20b shown in FIG. 2 and FIG. 3, the current channel and the voltage testing channel, both of which are conductive, may be formed through the four testing terminals and the three testing pins, the test resistance at the respective bonding point of the first part 11 and the second part 12 can be accurately determined based on the test voltage obtained by using the voltage testing channel and the constant current applied to the current channel, so as to determine whether a fault exists in the bonding connection of the first part 11 and the second part 12, and thereby to determine whether an abnormality exists in the bonding process of the first part 11 and the second part 12, and finding the cause of the electronic devices 20a, 20b being defective in time, and thus improving the production efficiency and the production yield.

It should be understood that the arrangement sequence of the three testing pads in the first testing area AA may be differently configured. In a non-limiting embodiment, the three testing pads of the first testing area AA may be configured as the second testing pad H2 or the third testing pad H3 being located between the other two testing pads. In another optional non-limiting embodiment, the three testing pads of the first testing area AA may be configured as the first testing pad H1 is located between the second testing pad H2 and the third testing pad H3. Those skilled in the art can determine the specific arrangement sequence of the three testing pads in the first testing area AA according to the actual applications, which is not limited in the present disclosure.

When the method 50 according to the exemplary embodiment of the present disclosure is used to detect the electronic devices 30a, 30b shown in FIGS. 4 and 5, the current channel and the voltage testing channel, both of which are conductive, can be formed through the four testing pads of the fifth testing area EE and the three testing pads of the fourth testing area DD of the electronic devices 30a, 30b, the test resistance at the respective bonding point of the first part 11 and the third part 13 can be accurately determined based on the test voltage obtained by using the voltage testing channel and the constant current applied to the current channel, so as to determine whether a fault exists in the bonding connection of the first part 11 and the third part 13, and thereby to determine whether an abnormality exists in the bonding process of the first part 11 and the second part 13, finding the cause of the electronic devices 30a, 30b being defective in time and avoiding the situation of inaccurate locating the abnormality caused by misjudgment, thus effectively improving the production efficiency and the production yield.

It should be understood that those skilled in the art can determine the number of each testing area according to the actual applications, which is not limited in the present disclosure, as long as the required correspondence relationship can be satisfied. It should also be understood that the connection lines between the testing pads H1 to H3 and the testing pins Y1 to Y3 shown in FIGS. 2 and 3 are the bonding points formed after the actual bonding process. In addition, the connection lines between the testing pads P4 to P6 and the testing pins J4 to J6 shown in FIGS. 4 and 5 are also the bonding points formed after the actual bonding process.

As described in detail hereinabove, the electronic devices 20a, 20b including the bonding connection as well as the first part 11 and the second part 12 included therein, of the exemplary embodiments shown in FIG. 2 and FIG. 3, may be any suitable electronic devices and electronic parts which use the bonding process to realize the bonding connection. As a non-limiting example, the electronic devices 20a, 20b may be a display device, the first part 11 may be a display panel, and the second part 12 may be an FPC board. Using the bonding process, the FPC board can be bonded on the display panel to form an FOP (FPC On Panel) circuit. In this embodiment, when the method 50 shown in FIG. 8 is used to detect the electronic devices 20a and 20b shown in FIG. 2 and FIG. 3, that is, the display device, the method 50 can be used to determine whether a circuit fault caused by the abnormal bonding process exists in the FOP circuit.

Also as described in detail hereinabove, the electronic devices 30a, 30b including the bonding connection as well as the first part 11, the second part 12 and the third part 13 included therein, of the exemplary embodiments shown in FIG. 4 and FIG. 5, may be any suitable electronic devices and electronic parts which use the bonding process to realize the bonding connection. As a non-limiting example, the electronic devices 30a, 30b may be a display device, the first part 11 may be a display panel, the second part 12 may be an FPC board, and the third part 13 may be a driving chip. Using the bonding process, the FPC board can be bonded on the display panel to form an FOP (FPC On Panel) circuit, and the driving chip can also be bonded on the display panel to form a COP (COF on Panel) circuit. In this embodiment, when the method 50 shown in FIG. 8 is used to detect the electronic devices 30a and 30b shown in FIG. 4 and FIG. 5, that is, the display device, the method 50 can be used to determine whether a circuit fault caused by the abnormal bonding process exists in the COP circuit.

In addition, as another non-limiting embodiment, the first part 11, the second part 12, and the third part 13 each include a bonding area, and therefore, the bonding process can be used to achieve the bonding connection. At least one of the first part 11, the second part 12 and the third part 13 is a circuit board. In this embodiment, when the method 50 shown in FIG. 8 is used to detect the electronic device including the first part 11, the second part 12 and the third part 13, it can be used to determine whether a circuit fault caused by the abnormal bonding process exists between the first part 11 and the second part 12 and/or between the first part 11 and the third part 13.

Apparently, the above-mentioned exemplary embodiments of the present disclosure are only to clearly illustrate the principles of the present disclosure, rather than to limit the present disclosure. For those of ordinary skill in the art, other different forms of variation and modification can be made on the basis of the foregoing description. Although the present disclosure cannot exhaust all the implementations, all variations or modifications obtained from the technical solutions of the present disclosure are deemed to fall within the protection scope of the present disclosure.

What is claimed is:

1. An electronic device including bonded parts, comprising:
    a first part, wherein the first part comprises a first bonding area, the first bonding area comprises at least one first testing area, the first testing area comprises a first testing pad, a second testing pad and a third testing pad, and the first testing pad is electrically connected with the second testing pad and the third testing pad; and
    a second part, wherein the second part comprises a second bonding area corresponding to the first bonding area, the second bonding area comprises a first testing terminal, a second testing terminal, a third testing terminal and a fourth testing terminal, the second bonding area also comprises at least one second testing area respectively corresponding to the at least one first testing area, and the second testing area comprises a first testing pin, a second testing pin and a third testing pin, wherein the first testing pad is bonded with the first testing pin, the second testing pad is bonded with the second testing pin, the third testing pad is bonded with the third testing pin, and wherein, the first testing pin is electrically connected with the first testing terminal and the second testing terminal, the second testing pin is electrically connected with the third testing terminal, the third testing pin is electrically connected with the fourth testing terminal.

2. The electronic device of claim 1,
wherein the first testing pad, the second testing pad and the third testing pad are arranged in one row, and
wherein the second testing pad is between the first testing pad and the third testing pad, or the third testing pad is between the first testing pad and the second testing pad.

3. The electronic device of claim 1, wherein the first testing pad, the second testing pad and the third testing pad are arranged in one row, and the first testing pad is between the second testing pad and the third testing pad.

4. The electronic device of claim 1, wherein at least one of the first part and the second part comprises a circuit board.

5. The electronic device of claim 1, wherein the electronic device comprises a display device, the first part comprises a display panel, the second part comprises a flexible printed circuit board.

6. The electronic device of claim 1, further comprising a third part, wherein the third part comprises a third bonding area, the third bonding area comprises at least one third testing area, the third testing area comprises a fourth testing pin, a fifth testing pin and a sixth testing pin, and the fourth testing pin is electrically connected with the fifth testing pin and the sixth testing pin,
wherein the first part further comprises:
a fourth bonding area, wherein the fourth bonding area corresponds to the third bonding area and comprises at least one fourth testing area respectively corresponding to the at least one third testing area, and the fourth testing area comprises a fourth testing pad, a fifth testing pad and a sixth testing pad; and
a fifth bonding area, wherein the fifth bonding area corresponds to the fourth bonding area and comprises at least one fifth testing area respectively corresponding to the at least one fourth testing area, and the fifth testing area comprises a seventh testing pad, an eighth testing pad, a ninth testing pad and a tenth testing pad,
wherein the second part further comprises a sixth bonding area corresponding to the fifth bonding area, the sixth bonding area comprises a fifth testing terminal, a sixth testing terminal, a seventh testing terminal and an eighth testing terminal, the sixth bonding area also comprises at least one sixth testing area respectively corresponding to the at least one fifth testing area, and the sixth testing area comprises a seventh testing pin, an eighth testing pin, a ninth testing pin and a tenth testing pin,
wherein the fourth testing pad is bonded with the fourth testing pin, the fifth testing pad is bonded with the fifth testing pin, the sixth testing pad is bonded with the sixth testing pin, the seventh testing pad is bonded with the seventh testing pin, the eighth testing pad is bonded with the eighth testing pin, the ninth testing pad is bonded with the ninth testing pin, the tenth testing pad is bonded with the tenth testing pin, wherein the seventh testing pin is electrically connected with the fifth testing terminal, the eighth testing pin is electrically connected with the sixth testing terminal, the ninth testing pin is electrically connected with the seventh testing terminal, the tenth testing pin is electrically connected with the eighth testing terminal, and wherein the ninth testing pad is electrically connected with the fifth testing pad, the seventh testing pad and the eighth testing pad are both electrically connected with the fourth testing pad, the tenth testing pad is electrically connected with the sixth testing pad.

7. The electronic device of claim 6,
wherein the fourth testing pin, the fifth testing pin and the sixth testing pin are arranged in one row, and
wherein the fifth testing pin is between the fourth testing pin and the sixth testing pin, or the six testing pin is between the fourth testing pin and the fifth testing pin.

8. The electronic device of claim 6, wherein the fourth testing pin, the fifth testing pin and the sixth testing pin are arranged in one row, and the fourth testing pin is between the fifth testing pin and the sixth testing pin.

9. The electronic device of claim 6, wherein at least one of the first part, the second part or the third part comprises a circuit board.

10. The electronic device of claim 6, wherein the electronic device comprises a display device, the first part a display panel, the second part comprises a flexible printed circuit board, and the third part comprises a driving chip.

11. A method for detecting an electronic device including bonded parts, wherein the electronic device comprises:
a first part, wherein the first part comprises a first bonding area, the first bonding area comprises at least one first testing area, the first testing area comprises a first testing pad, a second testing pad and a third testing pad, and the first testing pad is electrically connected with the second testing pad and the third testing pad; and
a second part, wherein the second part comprises a second bonding area corresponding to the first bonding area, the second bonding area comprises a first testing terminal, a second testing terminal, a third testing terminal and a fourth testing terminal, the second bonding area also comprises at least one second testing area respectively corresponding to the at least one first testing area, and the second testing area comprises a first testing pin, a second testing pin and a third testing pin,
wherein the first testing pad is bonded with the first testing pin, the second testing pad is bonded with the second testing pin, the third testing pad is bonded with the third testing pin, and
wherein, the first testing pin is electrically connected with the first testing terminal and the second testing terminal, the second testing pin is electrically connected with the third testing terminal, the third testing pin is electrically connected with the fourth testing terminal, and
wherein the method comprises:
applying a first constant current signal through the first testing terminal and the third testing terminal, or through the second testing terminal and the fourth testing terminal, or through the first testing terminal and the fourth testing terminal, or through the second testing terminal and the third testing terminal;
obtaining a first test voltage from two testing terminals selected from the first testing terminal, the second testing terminal, the third testing terminal and the fourth testing terminal of the second bonding area, which are not used for applying the first constant current signal;

determining a first test resistance based on the first test voltage and the first constant current signal; and determining whether the first test resistance meets a first preset resistance threshold.

12. The method of claim 11,
wherein the first testing pad, the second testing pad and the third testing pad are arranged in one row, and
wherein the second testing pad is between the first testing pad and the third testing pad, or the third testing pad is between the first testing pad and the second testing pad.

13. The method of claim 11, wherein the first testing pad, the second testing pad and the third testing pad are arranged in one row, and the first testing pad is between the second testing pad and the third testing pad.

14. The method of claim 11, wherein at least one of the first part or the second part comprises a circuit board.

15. The method of claim 11, wherein the electronic device comprises a display device, the first part comprises a display panel, the second part comprises a flexible printed circuit board.

16. The method of claim 11, wherein the electronic device further comprises a third part, wherein the third part comprises a third bonding area, the third bonding area comprises at least one third testing area, the third testing area comprises a fourth testing pin, a fifth testing pin and a sixth testing pin, and the fourth testing pin is electrically connected with the fifth testing pin and the sixth testing pin, wherein the first part further comprises a fourth bonding area corresponding to the third bonding area and comprising at least one fourth testing area respectively corresponding to the at least one third testing area, the fourth testing area comprising a fourth testing pad, a fifth testing pad and a sixth testing pad, and a fifth bonding area corresponding to the fourth bonding area and comprising at least one fifth testing area respectively corresponding to the at least one fourth testing area, the fifth testing area comprising a seventh testing pad, an eighth testing pad, a ninth testing pad and a tenth testing pad, wherein the second part further comprises a sixth bonding area corresponding to the fifth bonding area, the sixth bonding area comprises a fifth testing terminal, a sixth testing terminal, a seventh testing terminal and an eighth testing terminal, the sixth bonding area also comprises at least one sixth testing area respectively corresponding to the at least one fifth testing area, the sixth testing area comprises a seventh testing pin, an eighth testing pin, a ninth testing pin and a tenth testing pin, wherein the fourth testing pad is bonded with the fourth testing pin, the fifth testing pad is bonded with the fifth testing pin, the sixth testing pad is bonded with the sixth testing pin, the seventh testing pad is bonded with the seventh testing pin, the eighth testing pad is bonded with the eighth testing pin, the ninth testing pad is bonded with the ninth testing pin, the tenth testing pad is bonded with the tenth testing pin, wherein the seventh testing pin is electrically connected with the fifth testing terminal, the eighth testing pin is electrically connected with the sixth testing terminal, the ninth testing pin is electrically connected with the seventh testing terminal, the tenth testing pin is electrically connected with the eighth testing terminal, wherein the ninth testing pad is electrically connected with the fifth testing pad, the seventh testing pad and the eighth testing pad are both electrically connected with the fourth testing pad, the tenth testing pad is electrically connected with the sixth testing pad, and wherein the method further comprises:

applying a second constant current signal through the seventh testing terminal and the fifth testing terminal, or through the sixth testing terminal and the eighth testing terminal, or through the seventh testing terminal and the sixth testing terminal, or through the fifth testing terminal and the eighth testing terminal;

obtaining a second test voltage from two testing terminals selected from the fifth testing terminal, the sixth testing terminal, the seventh testing terminal and the eighth testing terminal of the sixth bonding area, which are not used for applying the second constant current signal;

determining a second test resistance based on the second test voltage and the second constant current signal; and determining whether the second test resistance meets a second preset resistance threshold.

17. The method of claim 16,
wherein the fourth testing pin, the fifth testing pin and the sixth testing pin are arranged in one row, and
wherein the fifth testing pin is between the fourth testing pin and the sixth testing pin, or the six testing pin is between the fourth testing pin and the fifth testing pin.

18. The method of claim 16, wherein the fourth testing pin, the fifth testing pin and the sixth testing pin are arranged in one row, and the fourth testing pin is between the fifth testing pin and the sixth testing pin.

19. The method of claim 16, wherein at least one of the first part, the second part or the third part comprises a circuit board.

20. The method of claim 16, wherein the electronic device comprises a display device, the first part comprises a display panel, the second part comprises a flexible printed circuit board, and the third part comprises a driving chip.

* * * * *